United States Patent
Oberle et al.

(10) Patent No.: US 7,487,060 B2
(45) Date of Patent: Feb. 3, 2009

(54) APPARATUS AND METHOD FOR TOLERANCE ANALYSIS FOR DIGITAL AND/OR DIGITIZED MEASURE VALUES

(75) Inventors: Hans-Dieter Oberle, Puchheim (DE); Sebastian Sattler, Munich (DE)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/546,073

(22) PCT Filed: Feb. 4, 2004

(86) PCT No.: PCT/DE2004/000175

§ 371 (c)(1),
(2), (4) Date: Oct. 18, 2006

(87) PCT Pub. No.: WO2004/077083

PCT Pub. Date: Sep. 10, 2004

(65) Prior Publication Data

US 2007/0239385 A1     Oct. 11, 2007

(30) Foreign Application Priority Data

Feb. 21, 2003   (DE) ............................... 103 07 690

(51) Int. Cl.
*G06F 19/00* (2006.01)

(52) U.S. Cl. .................. 702/117; 702/179; 700/159; 700/189

(58) Field of Classification Search ............. 702/117, 702/179; 700/159, 189

See application file for complete search history.

(56) References Cited

U.S. PATENT DOCUMENTS

| | | | |
|---|---|---|---|
| 4,791,357 A | 12/1988 | Hyduke | |
| 4,890,095 A | 12/1989 | Esser et al. | |
| 5,745,498 A | 4/1998 | Adams et al. | |
| 6,242,880 B1 * | 6/2001 | Hong | 318/571 |
| 6,353,646 B1 | 3/2002 | Rossignol | |
| 6,605,809 B1 * | 8/2003 | Engels et al. | 250/394 |
| 2002/0019962 A1 | 2/2002 | Roberts et al. | |
| 2004/0130354 A1 | 7/2004 | Fahrbach et al. | |

FOREIGN PATENT DOCUMENTS

| | | |
|---|---|---|
| DE | 197 05 406 | 8/1998 |
| DE | 199 05 709 | 8/2000 |
| EP | 0 042 878 | 1/1982 |
| JP | 56114037 | 8/1981 |
| WO | 02/14883 | 2/2002 |

\* cited by examiner

*Primary Examiner*—Tung S Lau
*Assistant Examiner*—Hien X Vo
(74) *Attorney, Agent, or Firm*—Dicke, Billig, Czaja, PLLC

(57) ABSTRACT

An electric tolerance analysis circuit for digital and digitized measured values has inputs for receiving a measured value, a reference value, and a tolerance value and also an output for transmitting an output value. The electric tolerance analysis circuit also has a checking device for checking the measured value using at least one prescribable tolerance criterion and has an output device for outputting an output value which is obtained from the state of the checking device, depending on whether or not the measured value meets the respective prescribed tolerance criterion.

27 Claims, 6 Drawing Sheets

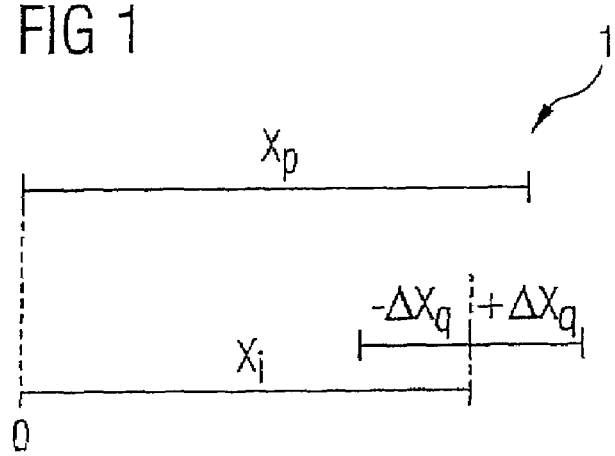
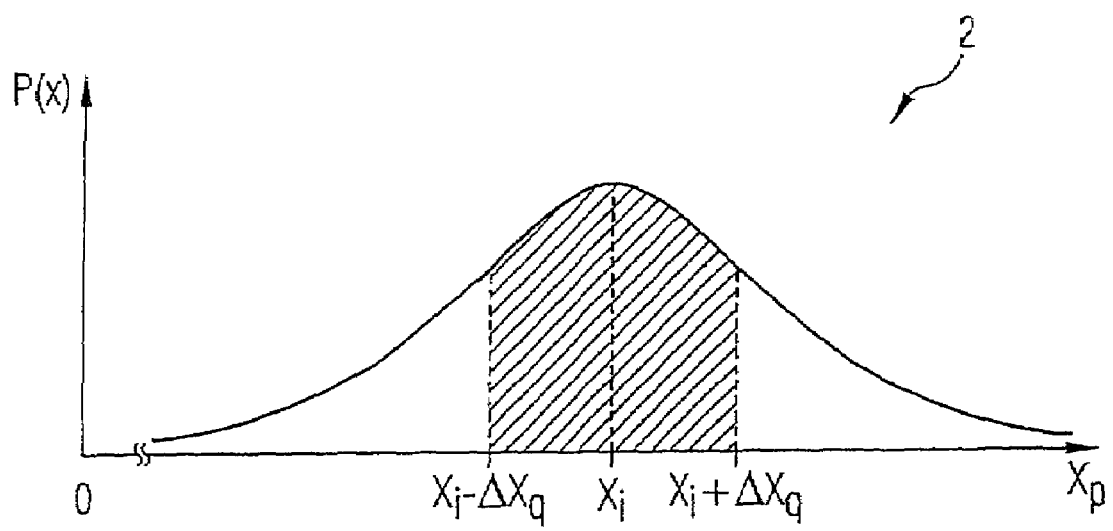
FIG 1

| Set | D | $X_a(t-1)$ | $X_a(t)$ | Mode used |
|---|---|---|---|---|
| 1 | 1 | 1 | 1 | Diagnosis mode |
| 1 | 1 | 0 | 1 | |
| 1 | 0 | 1 | 0 | No storage |
| 1 | 0 | 0 | 0 | |
| 0 | 1 | 1 | 1 | Production mode |
| 0 | 1 | 0 | 0 | Storage of 0 |
| 0 | 0 | 1 | 0 | |
| 0 | 0 | 0 | 0 | |

APPARATUS AND METHOD FOR TOLERANCE ANALYSIS FOR DIGITAL AND/OR DIGITIZED MEASURE VALUES

FIELD OF THE INVENTION

The invention relates to an apparatus and to a method for tolerance analysis for digital and/or digitized measured values.

BACKGROUND

Integrated electric circuits deliver particular output values depending on digital and/or digitized input values applied to their inputs. These output values govern the usability of the integrated electrical circuits. These output values are therefore frequently checked by tolerance analyses.

Such tolerance analyses are performed on external measuring appliances or on "testers". In this embodiment, the output values examined are tapped off on the I/O pins of the integrated electrical circuits.

It has hitherto not been possible to perform a self-test in electrical circuits in the field, during operation or for the purpose of diagnosis on the premises of the customer who purchases such integrated electrical circuits from the manufacturer.

SUMMARY

The present invention provides an inexpensive apparatus for tolerance analysis for digital and/or digitized measured values in which it is possible to perform self-tests in integrated electrical circuits.

In another embodiment, the present invention provides a rapidly performable method for tolerance analysis for digital and/or digitized measured values which can also be used for such a self-test.

The invention relates to an electric tolerance analysis circuit which can be used to check digital and digitized measured values using at least one prescribable tolerance criterion. In this embodiment, this electric tolerance analysis circuit includes inputs for receiving an n-bit measured value, an n-bit reference value and an (m+1)-bit tolerance value. The electric tolerance analysis circuit has a checking device for checking the measured value and an output device for outputting an output value. The output device may be in the form of a line or a data line, in the form of a display or in the form of a lamp, for example. The output value is obtained from the state of the checking device and states whether or not the respective measured value under consideration meets the respective prescribed tolerance criterion. In this embodiment, the measured value is checked for the respective prescribed tolerance criterion in the checking device.

The scope of the output values produced by the electric tolerance analysis circuit can be kept relatively small if the output value is merely in 1-bit form. In this embodiment, the output value advantageously assumes a value 0 if the respective measured value under consideration does not meet the respective prescribed tolerance criterion, and assumes a value 1 if the respective measured value under consideration does meet the respective prescribed tolerance criterion. An output value in such a form provides a reliable test result for the respective measured value under consideration and makes a Pass/Fail or Go/No-Go statement, uniquely associated with the respective measured value under consideration, about the quality of the measured value.

Such a tolerance analysis circuit can be used for very effectively and reliably checking a multiplicity of measured values using respectively associatable reference values and tolerance values. Such a tolerance analysis circuit is suitable not only for checking on external measuring appliances but also for tests during operation and for self-tests in electrical and electronic circuits.

In line with a first embodiment of the tolerance analysis circuit, two different modes are conceivable for the measured-value check which is to be performed in the checking device, namely the diagnosis or tolerance analysis mode and the production test mode. In the diagnosis mode, the measured value $x_p$ is tested to determine whether the equation $$(x_p - x_i) = \Delta x_q \quad (1)$$

is satisfied, and in the production test mode, it is tested to determine whether the equation $$|x_p - x_i| \leq \Delta x_i \quad (2)$$

is satisfied. In this embodiment, $x_i$ represents a prescribable reference value and $\Delta x_q$ represents a prescribable tolerance value.

The checking by the tolerance analysis circuit takes on a very transparent form as a result of these easily checkable tolerance criteria, and can additionally be performed very quickly and even at speed during operation of a circuit connected to the tolerance analysis circuit.

The inventive electric tolerance analysis circuit has a wide range of implementation options. By way of example, it may be implemented in the form of a microprocessor, in the form of a gate array, in the form of a digital signal processor or in the form of other conceivable electronic components.

In one advantageous development of the invention, the checking device in the tolerance analysis circuit has a subtractor and a tolerance filter connected to the subtractor. The subtractor has inputs for receiving the measured value and the reference value and produces a differential value from these two values. The tolerance filter has inputs for receiving the tolerance value and the differential value and produces the output value using the tolerance value and the differential value.

In such a checking device, the subtractor may also be in the form of a complement adder with an inverting input for receiving the reference value. This complement adder produces an addition value from the received measured value and from the ones complement or from the two's complement of the reference value and transmits this addition value to the tolerance filter. In this embodiment, the tolerance filter produces the output value using the tolerance value and the addition value provided by the complement adder.

In line with one basic concept of the invention, this allows any measurement to be referenced to a reference value and the tolerance evaluated using simple logic. In this embodiment, the addition value comprising the measured value and comprising the ones' complement of the reference value has a high likelihood of being situated in the binary number range of the tolerance band. The mathematical calculations in this tolerance band can be performed with relatively low computation complexity, especially since the middle and front bits of the binary number values under consideration in this reference band respectively have almost identical bit combinations.

In another embodiment of the invention, a mode selection variable is provided which can be applied externally to a further input of the tolerance analysis circuit, particularly of the tolerance filter. Using this mode selection variable, it is possible to stipulate individually for each measured value whether it is checked using the tolerance criterion of equation (1) or using the tolerance criterion of equation (2). Such a tolerance analysis circuit provides the user with a particularly high level of functionality and a wide range of application.

In line with one easy-to-implement and precisely operating implementation of the tolerance analysis circuit, the tolerance filter has a coarse filter, a fine filter and a flag register. In this embodiment, the input of the coarse filter is connected to the output of the subtractor or of the complement adder. The inputs of the fine filter are connected to the output of the subtractor or of the complement adder, to the output of the coarse filter, to a data line for receiving the tolerance value and/or the reference value and optionally to a data line for receiving the mode selection variable. An input of the flag register is connected to the output of the fine filter. In addition, a further input of the flag register may be connected to a data line for receiving the mode selection variable. In this embodiment, the output value is sent from the output of the flag register to the output device. Such an implementation of the tolerance filter is particularly optimum in terms of computation time and is relatively easy to implement.

In line with another embodiment of the invention, the coarse filter has a NAND gate and an OR gate. In this embodiment, the coarse filter processes the (n+1−m) front bits of the differential value produced by the subtractor or of the addition value produced by the complement adder and produces a, particularly 2-bit, output which indicates whether the measured value is above or below the reference value.

This particularly simple circuit implementation of the coarse filter takes advantage of the insight that the addition value produced is close to a value formed from the sum of the reference value and of the ones' complement of the reference value and that these two values each have easy-to-compare, ideally almost identical bit sequences in their front and middle ranges.

In line with another embodiment of the invention, only the m back bits or the LSBs or least significant bits of the differential value or of the addition value are routed to the fine filter. In this embodiment, the fine filter is designed such that it produces a, particularly 1-bit, measurement response which indicates whether the measured value under consideration meets the respective chosen tolerance criterion. This measurement response makes a reliable statement about the quality of the measured value.

A refinement of the flag register which is particularly simple in terms of circuitry comprises three AND gates and an OR gate. In the diagnosis mode, the flag register forwards the measurement response unchanged to the output device. In the production test mode, the flag register forwards the measurement responses unchanged only until it records a measurement response which indicates that the measured value currently under consideration does not meet the tolerance criterion under consideration. Such a measurement response is preferably implemented in practice in the form of a value zero. From the detection of such a measurement response onward, the flag register sets the output device and hence the output value permanently to zero. Hence, in the production test mode just a single failure to meet the tolerance criterion is stored. There is no provision for this in the diagnosis mode.

A tolerance analysis circuit equipped with such a flag register can thus reliably be used both in the development process and in production or for function testing.

The invention also relates to a tolerance analysis arrangement which has an electric tolerance analysis circuit as described above, a test circuit for receiving and for processing test stimuli and for producing measured values and also a memory unit. A data line for transmitting measured values connects the output of the test circuit to an input of the electric tolerance analysis circuit, particularly to an input of the subtractor or of the complement adder. A further data line for transmitting reference and tolerance values connects at least one output of the memory unit to at least one input of the electric tolerance analysis circuit, particularly to the subtractor or complement adder and to the fine filter. An input of the test circuit and an input of the memory unit receive a number of test stimuli synchronously in succession. In this embodiment, the memory unit associates at least one reference value and at least one tolerance value with each test stimulus.

In this context, the choice of the control variable for the test stimulus, for the reference value and for the tolerance value can be used to set whether each test stimulus has one or more respective reference and tolerance values associated with. The test stimuli are in this embodiment produced by an external appliance, particularly by a test generator, and are applied to the test circuit and to the memory unit.

In line with a further basic concept of the invention, the use of such a tolerance analysis arrangement requires no further external measuring appliances apart from an external test generator.

Another advantage of this tolerance analysis arrangement is that no additional pins need to be enabled on the test circuits in order to perform such tolerance analyses, but rather the normal pins which are available for inputting and outputting the operating data can be used. As a result of such a tolerance analysis arrangement, tolerance analysis using a self-test and using a test at speed is possible for the first time.

In a first embodiment of the inventive tolerance analysis arrangement, the memory unit also includes a counter which is connected by a further data line to the output device of the electric tolerance analysis circuit. In this arrangement, the counter associates counter readings with the reference values and tolerance values stored in the memory unit on the basis of the output values produced and respectively increments these counter readings by the absolute value of the output value in question.

This ensures that after a series of test stimuli have been processed it is possible to establish precisely which test stimuli have resulted in correct or in incorrect results at which reference and tolerance Values. In this embodiment, this counter is used particularly in the diagnosis mode. In the production test mode, it is possible to dispense with providing or starting up such a counter.

In line with one advantageous development of the memory unit, the memory unit comprises a reference value database which associates at least one respective reference value and at least one respective tolerance value with various test stimuli. Such a reference value database can be used to store and combine a multiplicity of reference and tolerance values and to associate them with particular respective test stimuli. Existing combinations of these values can easily be loaded from other storage media. It is likewise a simple matter to extend and change such reference value databases.

The invention also relates to a semiconductor chip or an IC which holds a tolerance analysis circuit as described above. In this embodiment, this tolerance analysis circuit is provided as an add-on, particularly in addition to the normal circuit. The invention also relates to a needle card for testing semiconductor chips or ICs which has an electric tolerance analysis circuit as described above integrated on it. The invention also relates to a tester-specific loadboard with test sockets for inserting semiconductor chips or ICs or for holding such a needle card or for connecting a handler, with such an electric tolerance analysis circuit being integrated on the loadboard. Such a loadboard can also be referred to as an adapter board.

The invention also relates to a measuring appliance or a tester with measuring sensors, e.g., for currents and for voltages, and with instruments for producing digital signals, intended for further processing using a computer system connected to the measuring appliance, from the measured currents and voltages. In this embodiment, the measuring appliance includes an electric tolerance analysis circuit as described above. The invention also relates to a computer system for recording digital signals produced by a measuring appliance, with the computer system including an electric tolerance analysis circuit as described above.

In line with a further basic concept of the invention, the inventive electric tolerance analysis circuit, including with such a memory unit, can be provided easily and in highly space-saving fashion on all possible circuits or appliances at any abstraction level or on any measuring appliance level. The manner of operation is not adversely affected in this embodiment. The specific refinement of the articles with the electric tolerance analysis circuit which are described above can be taken by the person skilled in the art fully and unambiguously from the information contained in this patent specification and also from his specialist knowledge. In this context, it is merely necessary to remember that the electric tolerance analysis circuit respectively needs to be added in addition to the circuits which the aforementioned articles contain.

The invention also relates to the use of the electric tolerance analysis circuit, of the electric tolerance analysis arrangement, of the semiconductor chip, of the needle card, of the loadboard, of the measuring appliance and of the computer system in one of the embodiments described above for a general tolerance measurement, for an eye diagram test, for a data dependent jitter analysis, for an ADC test, for a random jitter test, for a deterministic jitter test, for a DAC/ADC test or for a pseudorandom bit test.

The invention also relates to a method for tolerance analysis for digital and/or digitized measured values in which a tolerance analysis arrangement as described above and also a test stimulus generator are first of all provided. In this embodiment, the tolerance analysis arrangement, particularly the corresponding inputs of the test circuit and of the memory area, is connected to an output of the test stimulus generator.

This method involves a digital or digitized test stimulus being first of all produced by the test stimulus generator and then being applied synchronously to the test circuits and to the memory area. Next, a measured value is produced by the test circuit by processing the test stimulus, and this measured value is applied to the electric tolerance analysis circuit. Essentially in parallel therewith, at least one reference value and at least one tolerance value are associated with the test stimulus by the reference value database of the memory area. This tolerance value or these tolerance values and this reference value or these reference values are then applied to the electric tolerance analysis circuit. In the embodiment of a tolerance analysis arrangement which has no provision for a mode selection variable, the previously set tolerance criterion is checked in this embodiment.

The tolerance analysis circuit's checking device then produces an output value by checking the measured value for the appropriate tolerance criterion based on one of the equations (1) or (2). This output value is provided at the output of the electric tolerance analysis circuit by the output device for further processing.

The inventive method, starting with the method of producing a digital or digitized test stimulus using the test stimulus generator, are repeated in this context as many times as required until the desired number of test stimuli which is produced by the test stimulus generator and/or prescribed by the user has been processed.

In another embodiment of the invention, such a tolerance analysis method can be performed on chip or on loadboard without requiring external measuring appliances. A self-test for diagnosis in the field is also possible in this embodiment. In this context, the inventive method has a very simple and easily implemented cycle and can accordingly be used for tolerance analysis for circuits of almost any complexity.

In line with one advantageous development of the method, a mode selection variable is provided. In such a tolerance analysis arrangement, a value for this mode selection variable is prescribed at the start of the method or when the test stimuli are produced by the test stimulus generator. After that, the tolerance criterion selected using this mode selection variable is checked. Such a method provides the user with additional functionality and puts him in a position to be able to select the respective method mode which is suitable for his current requirements.

In a further embodiment of this tolerance analysis method, the output device routes the output value to the counter, which associates the output value with a counter value for the respective reference and tolerance value under consideration and finally increments this counter value by the absolute value of the output value. In this embodiment, this method variant is chosen for the diagnosis mode, in particular. This means that even after the processing it is possible to establish reliably a multiplicity of test stimuli, those test stimuli for which errors have been detected and those for which they have not.

The invention is also realized in a computer program for performing the method for tolerance analysis for digital and/or digitized measured values.

In this context, the computer program contains program instructions which prompt a computer system to perform such methods in an embodiment as described above. In this embodiment, particularly the method starting with the method of producing a digital or digitized test stimulus using the test stimulus generator are performed on a computer system.

As a result, the computer program outputs the output values on an output unit, particularly on a screen or on a printer. On the basis of these output values, particularly if the diagnosis mode has been chosen, it may be possible to make improvements to the test circuit. If the production test mode has been chosen, a reliable Pass/Fail statement can be made about the functionality of the test circuit. The inventive computer program allows electrical and electronic components of almost any complexity to be tested quickly, effectively and reliably.

The invention also relates to a computer program which is held on a storage medium, which is stored in a computer memory, which is contained in a read only memory or in a ROM store or which is transmitted on an electrical carrier signal. The invention also relates to a carrier medium, particularly a data storage medium, such as a diskette, a zip drive, a streamer, a CD or DVD which store a computer program as described above. The invention also relates to a computer system which stores such a computer program. Finally, the invention relates to a method in which such a computer program is downloaded from an electronic data network, such as the Internet, to a computer which is connected to the data network.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a numerical line representation and also a frequency distribution for a measured value in each embodiment in relation to a reference value.

DETAILED DESCRIPTION

Figure 2:
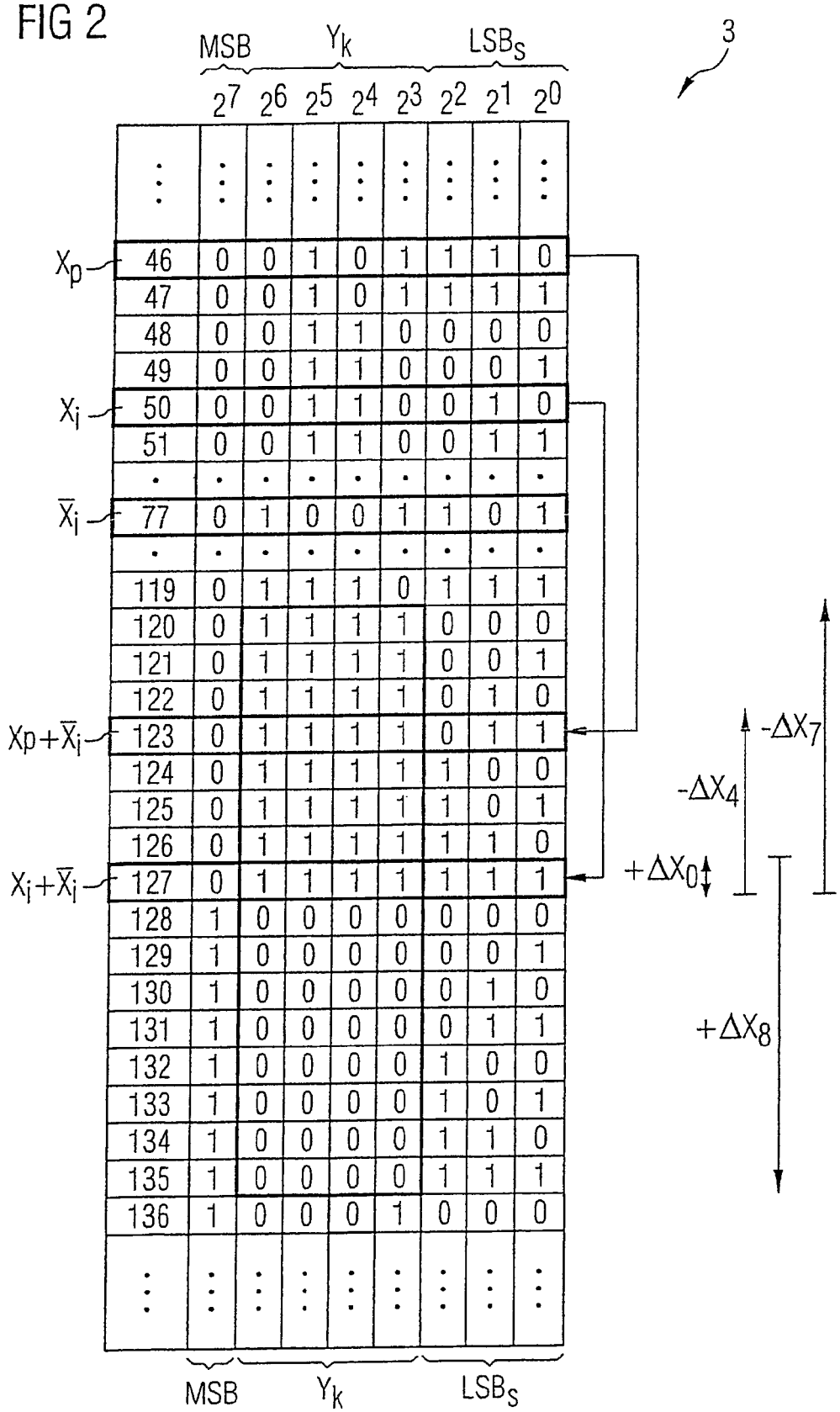
FIG. 2 illustrates a numerical range representation for an exemplary embodiment with a measured value, with a reference value and with a tolerance value.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a numerical line representation 1 and a frequency distribution 2 for a measured value $x_p \geq 0$, in each embodiment in relation to a reference value $x_i \geq 0$.

The measured value $x_p$ is digital or digitized and, in line with a user preset, is intended to be in a defined tolerance range $$|x_p - x_i| \leq \Delta x_i.$$

In this embodiment, $\Delta x_q$ represents an associated tolerance which can be prescribed by a user. The numerical line representation 1 illustrates the reference value $x_i$ and the measured value $x_p$ using two numerical lines arranged one above the other. The tolerance range $[x_i - \Delta x_q; x_i + \Delta x_q]$ is represented by means of two numerical line sections $-\Delta x_q$ and $+\Delta x_q$ starting just above the right-hand end of the bottom numerical line. It can be seen from FIG. 1 that the measured value $x_p$ is greater than the prescribed reference value $x_i$ and is situated within the defined tolerance range $[x_i - \Delta x_q; x_i + \Delta x_q]$.

An additional offset makes it possible to ensure that the values $x_p$; $x_i$ are always positive.

The probability distribution 2 illustrates the measured values $x_p$ grouped around the reference value or nominal value $x_i$. The tolerance range $|x_p - x_i|$ is stipulated by the tolerance value $\Delta x_q$ and defines the frequency for the occurrence of a measured value $x_p$ in the range shown by the shaded area in FIG. 1. In this embodiment, triples $(x_p; x_i; \Delta x_q)$ can be formed in order to associate reference values $x_i$ and tolerance values $\Delta x_q$ with the measured values $x_p$. The probability distribution 2 represents a probability distribution for a number of triples $(x_p; x_i; \Delta x_q)$, with the reference value $x_i$ and the tolerance values $\Delta x_q$ being individually prescribable and the measured values $x_p$ being able to be determined by any measurement.

Accordingly, measured values $x_p$ situated in the tolerance range $[x_i - \Delta x_q; x_i + \Delta x_q]$ are considered to be admissible, and measured values $x_p$ which are not arranged in this tolerance range need to be reliably detected in line with the invention. In this embodiment, the invention provides a diagnosis mode (also called tolerance analysis mode) and a production test mode.

In the diagnosis mode, the prescribed condition is the equation (1). In this embodiment, the reference value $x_i$ has the control variable i. The tolerance value $\Delta x_q$ has the control variable q in this embodiment. By providing different control variables i and q for the reference value $x_i$ and for the tolerance value $\Delta x_q$, it is possible to provide a multiplicity of tolerance values $\Delta x_q$ for a single reference value $x_i$.

In the production test mode, the prescribed condition is the equation (2). In this embodiment, the reference value $x_i$ and the tolerance value $\Delta x_q = \Delta x_i$ have the same control variable i. It is therefore possible to prescribe just one respective tolerance value $\Delta x_i$ for each reference value $x_i$. In the embodiment of such a production test, all measured values $x_p$ are considered and finally a Go/No-Go or Pass/Fail decision is made for the whole of the tested component which has produced the measured values $x_p$.

The fundamental principle for implementing the equations (1) and (2) in circuitry is based on the use of the ones' complement $\overline{x}_i$ for subtracting $x_p$ and $x_i$, as can be seen from the following equation (3).

$$(x_p - x_i - 1) = (x_p + \overline{x}_i) \qquad (3)$$

This transforms the difference $x_p - x_i$ into a numerical range which is distinguished by easily decoded binary patterns.

FIG. 2 illustrates a numerical range representation 3 for an exemplary embodiment with a measured value $x_p = (46)_{10} = (101110)_2$, with a reference value $x_i = (50)_{10} = (110010)_2$ and with a tolerance value $\Delta x_q = (7)_{10} = (111)_2$.

The numerical range representation 3 has a total of 9 columns arranged next to one another and a multiplicity of rows arranged one below the other in FIG. 2. In this embodiment, the numerical range representation 3 illustrates numbers respectively rising from top to bottom in decimal representation in the first column and in binary representation in the further eight columns. Rows containing numbers which are not relevant to the subsequent calculation are shown abbreviated by respective dots in FIG. 2.

In the binary representation in columns 2 to 9, an 8-bit representation has been chosen. The first column of the binary representation illustrates the respective most significant bit, also referred to as an MSB. The last three columns each represent the three least significant bits, also referred to as LSBs. The bits situated between the MSB and the LSBs are denoted by $y_k$ in the present exemplary embodiment.

In the present exemplary embodiment, the ones' complement $\bar{x}_i$ is $\bar{x}_i=(77)_{10}=(1001101)_2$. $(x_p+\bar{x}_i)$ from equation (3) gives $(123)_{10}=(01111011)_2$. In addition, the value $(x_i+\bar{x}_i)$ is of interest, this giving $(127)_{10}=(01111111)_2$. This is because the first of the eight binary positions experiences bit overflow, i.e. the MSB changes from 0 to 1.

The method described is also possible, in principle, with the two's complement. A detailed description is not given here.

The value $(7)_{10}=(111)_2$ for the tolerance value $\Delta x_7$ has been chosen in order to limit the tolerance value to m=3 binary positions. In the present exemplary embodiment, these m=3 binary positions are the LSBs. The LSBs of the reference value $(x_i+\bar{x}_i)$ each adopt the value 1.

The tolerance range is determined by subtracting or adding the respective tolerance value $\Delta x_7$ from the reference value $(x_i+\bar{x}_i)$. The adjustable and hence measurable tolerance range from $-\Delta x_7$ to $+\Delta x_8$ for the LSBs extends from $(120)_{10}=(1111000)_2$ to $(135)_{10}=(10000111)_2$ in the embodiment of numerical range representation 3 shown in FIG. 2.

The MSB indicates the arithmetic sign of the value obtained from equation (3). If this value is negative, the MSB assumes the value 0. If the value obtained from equation (3) is positive, the MSB has the value 1.

The numerical values situated in the tolerance range $2\Delta x_q$ can be detected explicitly from the MSB and from the LSBs, because the bit positions $y_k$ assume the value 1 for a negative arithmetic sign, i.e. when the value of the MSB is 0, and the value 0 for a positive arithmetic sign, i.e. when the value of the MSB is 1.

The following equation (4) indicates the minimum term or the min. term for $-\Delta x_4$ from FIG. 2.

$$-\Delta x_4 = \overline{MSB} \char`\^ (y_4 \char`\^ y_3 \char`\^ y_2 \char`\^ y_1) \char`\^ (\overline{LSB}_3 \char`\^ LSB_2 \char`\^ LSB_1) \qquad (4)$$

The min. term shown in equation (4) indicates the measurable conversion of the value $x_p+\bar{x}_i-\Delta x_4$ for the reference value $x_i=(50)_{10}$. The bit positions, which assume the value 0 in this embodiment, namely the MSB and the frontmost LSB, are in this embodiment represented in complementary form in order to be able to measure these positions using a 1. This is in accordance with specialist knowledge relating to circuitry and is not explained in more detail here.

When triple $(x_p; x_i; \Delta x_q)=((46)_{10}; (50)_{10}; -\Delta x_4)$ appears, both the tolerance analysis and the production test need to generate a 1 as output value $x_a$. For the tolerance analysis, this means that the measured value $x_p=(46)_{10}$ is at a distance of precisely $\Delta x_q=-(4)_{10}$ away from the reference value $x_i=(50)_{10}$. For the production test, this means that the measured value $x_p=(46)_{10}$ is situated within the tolerance range $x_i \pm \Delta x_i = (50\pm 4)_{10}$.

If, by way of example, the chosen tolerance value were to be the value $\Delta x_0=0$, both the tolerance analysis and the production test for the triple $((46)_{10}; (50)_{10}; +\Delta x_0)$ would generate an output value $x_a=0$ which signals that the measured value $x_p$ failed the test, that is to say a "fail".

When a production test is performed, normally a multiplicity of measured values $x_p$ are generated and checked in succession. In this embodiment, when a measured value $x_p$ which is not in the tolerance range appears, this result needs to be stored and hence an output value $x_a=0$ also needs to be generated for all subsequent measured values $x_p$, regardless of whether the subsequent measured values $x_p$ are in the tolerance range and the respective output value $x_a$ associated with these measured values $x_p$ would assume the value 1.

During the tolerance analysis, all output values $x_a=1$ which appear need to be sorted on the basis of the tolerance values $\Delta x_q$. This is also called binning.

From the numerical range representation 3, it becomes clear that only the LSBs need to be considered in order to determine the situation of the measured value $x_p$ in the tolerance range. The MSB and the $y_k$ each have an almost identical structure in the tolerance range. The inventive procedure of this type allows the hardware complexity for the tolerance analysis performed here to be kept very low.

Figure 3:
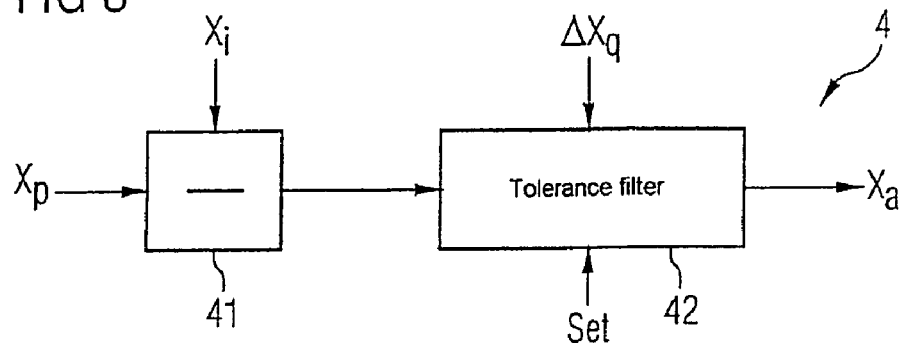
FIG. 3 illustrates one embodiment of a basic circuit diagram of a first tolerance analysis circuit with a subtractor and with a tolerance filter.

FIG. 3 illustrates a basic circuit diagram of a first tolerance analysis circuit 4 with a subtractor 41 and with a tolerance filter 42.

In this embodiment, the subtractor 41 and the tolerance filter 42 are each shown as rectangles and the input and output variables of the subtractor 41 and of the tolerance filter 42 are each shown in the form of arrows. As input variables, the prescribable reference value $x_i$ and the measured value $x_p$ generated by a circuit which is not illustrated in FIG. 3 flow into the subtractor 41 arranged to the left of the tolerance filter 42 in FIG. 3. The subtractor 41 forms the difference $x_p-x_i$ and forwards this differential value to the tolerance filter 42.

The tolerance filter 42 can be operated either in diagnosis mode or in production test mode. In this embodiment, these two modes are selected by the mode selection variable "Set", which assumes the value 1 to select the diagnosis mode and the value 0 to select the production test mode.

The tolerance value $\Delta x_q$ is another input variable for the tolerance filter 42. From the differential value $x_p-x_i$ provided by the subtractor 41 and from the tolerance value $\Delta x_q$, the tolerance filter 42 produces an output value $x_a$, which is a 1-bit value in the present exemplary embodiment, on the basis of equation (1) or (2), depending on the mode selected using the mode selection variable "Set", said output value being able to assume the value 0 (Fail) or the value 1 (Pass).

When the first tolerance analysis circuit 4 is operating in diagnosis mode (Set=1), an output value $x_a=1$ is produced for the measured value $x_p=(46)_{10}$ with a given reference value $x_i=(50)_{10}$ and a given tolerance value $\Delta x_q=(4)_{10}$. For all measured values $x_p$ which differ from $x_p=(46)_{10}$, equation (1) is not satisfied, which results in the output value $x_a=0$ being produced and output.

When the first tolerance analysis circuit 4 is operating in production test mode (Set=0), an output value $x_a=1$ is produced for all measured values $x_p$ which are in the tolerance range based on equation (2) with a given reference value $x_i=(50)_{10}$ and with a given tolerance value $\Delta x_q=(4)_{10}$. The measured value $x_p$ is in this tolerance range, and accordingly the output value is $x_a=1$ for the measured value $x_p=(46)_{10}$.

Figure 4:
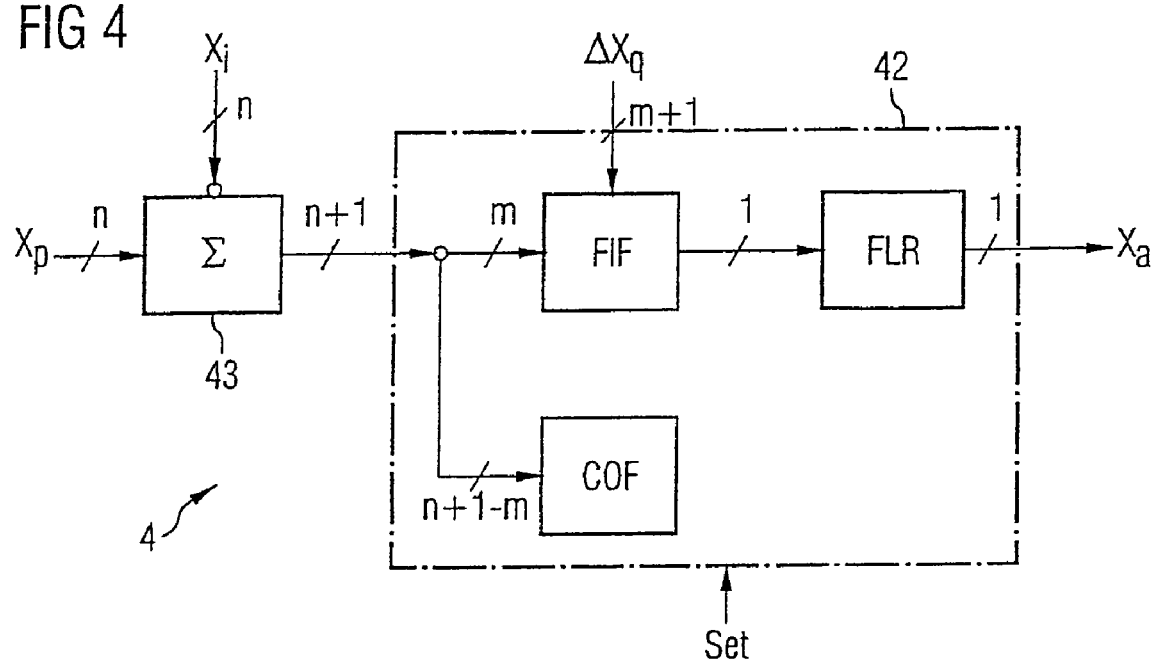
FIG. 4 illustrates another embodiment of a basic circuit diagram of the first tolerance analysis circuit with a higher level of detail.

FIG. 4 illustrates a further basic circuit diagram of the first tolerance analysis circuit 4 with a higher level of detail.

In the illustration in FIG. 4, the arrows, which denote the input and output variables, each have parameters indicated on them which represent the number of bits which is required to represent the respective variable in the binary system. The subtractor 41 has been replaced by the complement adder 43 in FIG. 4, said complement adder adding the measured value $x_p$ to the ones' complement $\bar{x}_i$ of the reference value $x_i$ in line with equation (3). In this embodiment, that input of the complement adder 43 to which the reference value $x_i$ is supplied is in inverted form. The measured value $x_p$ and the reference value $x_i$ are each n-bit values in this embodiment, and the value $x_p+\bar{x}_i$ formed by the complement adder 43 is in (n+1)-bit form.

In FIG. 4, the tolerance filter 42 comprises a fine filter FIF, a coarse filter COF and a flag register FLR. The (n+1)-bit output value $x_p+\bar{x}_i$ from the complement adder 43 is split into the m least significant bits, namely into the LSBs, which are supplied to the fine filter FIF, and into the (n+1−m) front bits, namely the MSB and the $y_k$ bits, which are supplied to the coarse filter COF.

The coarse filter COF examines the MSB and the $y_k$ bits. For the purpose of examining these bits, the coarse filter COF may be of relatively simple design, as shown below in FIG. 5, because the bits to be examined by the coarse filter COF are each very similar close to the reference value $x_i+\bar{x}_i$. The coarse filter COF delivers a 2-bit response to the fine filter FIF, said response stating whether the measured value $x_p$ is greater than or less than the reference value $x_i$.

The fine filter FIF receives an (n+1)-bit tolerance value $\Delta x_q$ whose m bits contain the LSBs and whose (m+1)th bit contains information about whether the tolerance value $\Delta x_q$ is situated above or below the reference value $x_i$.

From the tolerance value $\Delta x_q$, from the value provided by the coarse filter and from the LSBs of the measured value $x_p$, the fine filter FIF calculates a 1-bit measurement response D which states whether the measured value $x_p$ has passed or has not passed the check which took place in the fine filter FIF. The test mode to be carried out in the fine filter FIF in this embodiment can be set using the mode selection variable "Set", as already explained with reference to FIG. 3.

In line with FIG. 4, the measurement response D produced by the fine filter FIF is supplied to the flag register FLR. This flag register FLR may be in different forms.

In the diagnosis mode, the measurement responses D from the fine filter FIF are output by the flag register FLR as output values $x_a$. This is because the diagnosis mode is frequently used for chip development, which, according to experience, still produces a few errors and for which it is important to detect every single error in order to be able to correct it.

In the production test mode, it is important to detect whether the finished chip operates correctly, since even the occurrence of a single error can render the chip unusable. Accordingly, when a single error occurs, the output $x_a$ is permanently set to 0 (Fail). In this embodiment, the flag register FLR is designed such that it checks the measurement responses D from the fine filter FIF and outputs them as output values $x_a$ while the measurement responses each assume the value 1. As soon as a measurement response D=0 is recorded by the flag register FLR, the output values $x_a$ are set permanently to 0.

Figure 5:
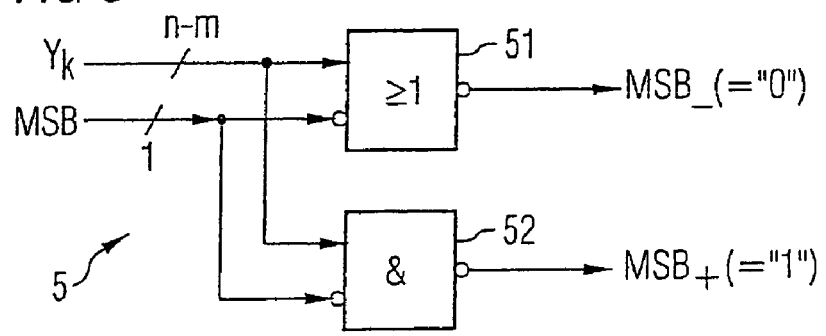
FIG. 5 illustrates a coarse filter gate diagram of the coarse filter from FIG. 4.

FIG. 5 illustrates a coarse filter gate diagram 5 for the coarse filter COF from FIG. 4.

The coarse filter COF is divided into a NOR gate 51 and into a first NAND gate 52. The (n−m)-bit $y_k$ bits and the 1-bit MSB are in this embodiment respectively supplied to the NOR gate 51 and to the first NAND gate 52, with the MSB being respectively inverted. The output variable obtained from the NOR gate 51 is the 1-bit value $MSB_-$. The output variable obtained from the first NAND gate 52 is the 1-bit value $MSB_+$. In this embodiment, the variables $MSB_-$ and $MSB_+$ may each assume the values 0 or 1. The values $MSB_-=MSB_+=0$ state that the measured value $x_p$ is lower than the reference value $x_i$, but is still situated within the maximum valid tolerance range. The values $MSB_-=MSB_+=1$ respectively state that the measured value $x_p$ is higher than the reference value $x_i$, but is still situated within the maximum valid tolerance range.

The indices p, i and q of the measured value $x_p$, of the reference value $x_i$ and of the tolerance value $\Delta x_q$ each represent control variables. In this embodiment, the reference values $x_i$ and the tolerance values $\Delta x_q$ are decoupled from one another, because their control variables are in different forms. This means that two reference values $x_i$ and four respective tolerance values $\Delta x_q$ can be chosen for a measured value $x_p$, for example. If the control variables of the reference value $x_i$ and of the tolerance value $\Delta x_q=\Delta x_i$ match, a respective identical number of reference values $x_i$ and tolerance values $\Delta x_i$ is considered for a measured value $x_p$.

The coarse filter gate diagram 5 is just one example of a hardware implementation of the coarse filter COF. A multiplicity of other hardware implementations of the coarse filter COF are conceivable which have the described functionality.

Figure 6:
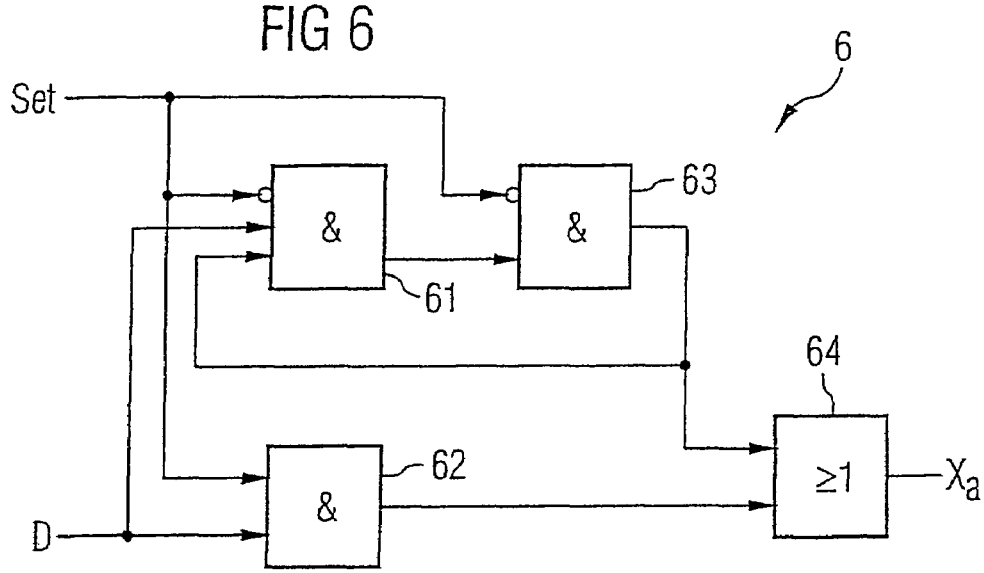
FIG. 6 illustrates a flag register gate diagram and an associated flag register truth table for the flag register from FIG. 4.

FIG. 6 illustrates a flag register gate diagram 6 and an associated flag register truth table 7.

The flag register gate diagram 6 comprises a second NAND gate 61, a third NAND gate 62, a fourth NAND gate 63 and an OR gate 64. The mode selection variable Set shown at the top left of the flag register gate diagram 6 and the measurement response D shown at the bottom left represent the input variables for the flag register FLR shown in FIG. 6. The output value $x_a$ shown at the bottom right of the flag register gate diagram 6 represents the output variable produced by the flag register FLR, which output variable provides information about the quality of the measured value $x_p$.

The second NAND gate 61 has an inverting input for the mode selection variable Set, a further input for the measurement response D from the fine filter FIF and an input from the fourth NAND gate 63. The third NAND gate 62 comprises an input for the mode selection variable Set and a further input for the measurement response D from the fine filter FIF. The fourth NAND gate 63 comprises an input from the second NAND gate 61 and an inverted input for the mode selection variable Set. The OR gate 64 comprises an input from the fourth NAND gate 63 and a further input from the third NAND gate 62.

The flag register truth table 7 comprises nine rows and five columns. The topmost row illustrates the headings "Set", "D", "$x_a(t-1)$", "$x_a(t)$" and "Mode used" for the values contained in the other rows. In this embodiment, the last column "Mode used" serves as an explanation and often does not appear in the truth tables used in practice.

Rows two to nine contain all conceivable combinations of the input variable Set, D and of the previous output value $x_a(t-1)$ and also the respective output value $x_a(t)$ desired for these input variables at time t. In this embodiment, rows two to five have the value 1 and rows six to nine each have the value 0 for the mode selection variable Set. Accordingly, the flag register FLR and hence the entire first tolerance analysis circuit 4 are operated in rows two to five in diagnosis mode and in rows six to nine in production test mode.

In practice, truth tables such as the flag register truth table 7 frequently represent the model for an electric circuit which is to be produced or for a gate diagram which is to be produced. The conversion (also called synthetization) of such a truth table into a gate diagram or into a real electric circuit is in this embodiment performed in largely automated fashion using suitable computer programs. In this embodiment, user intervention or even the manual production of a gate diagram, such as the flag register gate diagram 6, is dispensed with completely.

The flag register gate diagram 6 is one example of a hardware implementation of the flag register FLR. A multiplicity of other hardware implementations of the flag register FLR are possible which implement the functionality indicated in the flag register truth table 7.

The measurement response D can be stored in production test mode only if it is stable. Additional circuit measures (not described in more detail here) need to be used to prevent brief signal changes from being stored during the processing.

Figure 7:
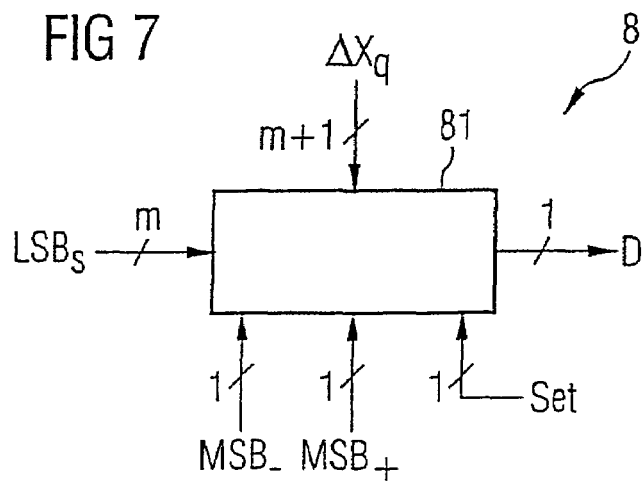
FIG. 7 illustrates a fine filter black box diagram of the fine filter from FIG. 4.

FIG. 7 illustrates a fine filter black box diagram 8 of the fine filter FIF with a fine filter black box 81 and with input and output variables shown in the form of arrows.

In this embodiment, the values indicated at the arrows each represent the number of bits in the input or output variable in question. The fine filter black box diagram 8 is based on the detail from the fine filter FIF from FIG. 4, with the variable names being indicated explicitly.

The m-bit LSBs of the value formed $x_p - x_i$ or $x_p + \bar{x}_i$ which are provided by the subtractor 41 or by the complement adder 43 form the first input variable for the fine filter FIF. The respectively 1-bit variables $MSB_-$ and $MSB_+$ provided by the coarse filter COF form the second and third input variables for the fine filter FIF. The 1-bit mode selection variable Set forms a further input variable for the fine filter FIF. The last input variable for the fine filter FIF is formed by the (m+1)-bit tolerance value $\Delta x_q$.

On the basis of these input values, the fine filter FIF produces a 1-bit measurement response D which forms the output variable from the fine filter FIF. The person skilled in the art can obtain the precise operation of the fine filter FIF from the check on the conditions contained in equations (1) and (2).

Figure 8:
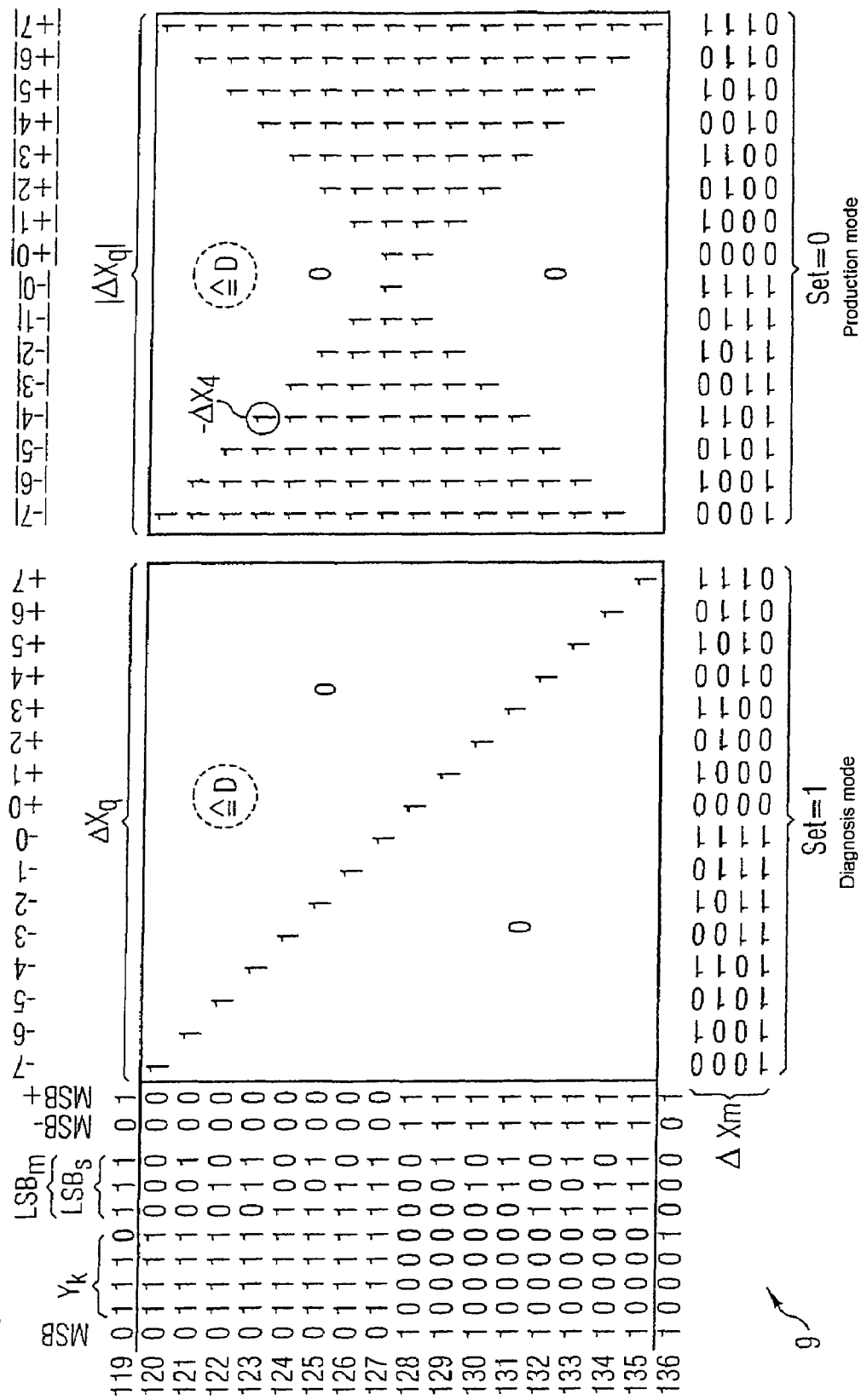
FIG. 8 illustrates a fine filter truth table providing the basis for the fine filter illustrated in FIGS. 4 and 7.

FIG. 8 illustrates a fine filter truth table 9 which forms the basis of the fine filter FIF.

The left-hand side of the fine filter truth table 9 illustrates the range which is relevant to the present exemplary embodiment from the numerical range representation 3, specifically the range from $x_p = (120)_{10} = (1111000)_2$ to $x_p = (135)_{10} = (10000111)_2$. Next to that, two columns show the values of the variables $MSB_-$ and $MSB_+$ which correspond to the numbers from the numerical range representation 3.

The range illustrated to the right of that in the fine filter truth table 9 is divided into a left-hand range for the diagnosis mode, in which the mode selection variable Set assumes the value 1, and into a right-hand range for the production test mode, in which the mode selection variable Set assumes the value 0. For the numerical range from $x_p = (120)_{10} = (01111000)_2$ to $x_p = (135)_{10} = (10000111)_2$, both the range for the diagnosis mode and the range for the production test mode comprise a respective 16×16 matrix which contain the measurement responses D=[0; 1] for the respective tolerance values $\Delta x_q$ shown above them and for the respective values of $\Delta x_m$ shown below them. The tolerance values $\Delta x_q$ shown above the two 16×16 matrices respectively vary in the numerical range from −7 to +8 both for the diagnosis mode and for the production test mode. In this embodiment, the respective tolerance value $\Delta x_q$ is considered for the diagnosis mode and the respective tolerance value absolute value $|\Delta x_q|$ is considered for the production test mode. Below the two 16×16 matrices, the respective values $\Delta x_m$ corresponding to the last position of $y_k$ and to the LSBs are shown. The values $\Delta x_m$ respectively vary from $\Delta x_m = (8)_{10} = (1000)_2$ to $\Delta x_m = (15)_{10} = (1111)_2$ and from $\Delta x_m = 0_{2;10}$ to $\Delta x_m = (7)_{10} = (0111)_2$ both for the diagnosis mode and for the production test mode.

In diagnosis mode, only the measurement responses D arranged on the primary diagonal of the 16×16 matrix assume the value 1. The measurement responses D which are not situated on the primary diagonal of the 16×16 matrix each have the value 0.

In production test mode, the values in the 16×16 matrix which are on the primary diagonal, those on the secondary diagonal and also the values enclosed by the primary and secondary diagonals in the left-hand range of this matrix and the measurement responses D enclosed by the secondary and primary diagonals in the right-hand range of this matrix assume the value 1. The other measurement responses D assume the value 0.

In this embodiment, the measurement responses D contained in the diagnosis mode's or the production test mode's 16×16 matrices described in the present exemplary embodiment represent the output variables, and the other values $MSB_-$, $y_k$, $LSBs$, $MSB_-$, $MSB_+$, $\Delta x_q$ and $|\Delta x_q|$ and also $\Delta x_m$ represent the input variables.

In practical circuit development, truth tables such as the fine filter truth table 9 shown in FIG. 8 represent a complete model for producing a gate diagram and finally for the electric circuit which is to be developed. Such complete stipulation of an electric circuit may also be prescribed in the form of mathematical functions.

On the basis of such a truth table or a number of mathematical functions, a gate diagram of an electric circuit is produced using suitable computer programs which are known to the person skilled in the art, known as "synthesis tools". When creating such gate diagrams, the values of the input and output variables described are applied to the synthesis tool used, whereupon the synthesis tool automatically produces a gate diagram.

The explanation of the creation of a gate diagram using a synthesis tool from this fine filter truth table 9 is highly complex and requires a great deal of clarification. In addition, there are a multiplicity of conceivable gate diagrams which implement the fine filter truth table 9. Accordingly, a specific gate diagram produced from the fine filter truth table 9 is not specified, especially since an exemplary gate diagram of this type to explain the invention could not provide anything which is not already obvious from FIG. 8 and from the corresponding description of the figure.

Figure 9:
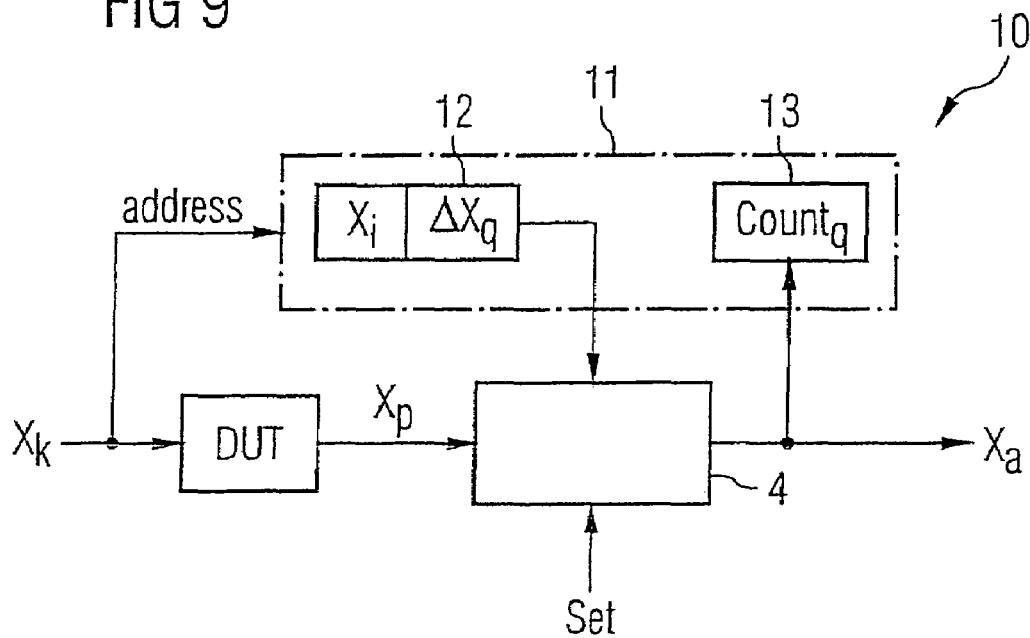
FIG. 9 illustrates a first tolerance analysis arrangement with the first tolerance analysis circuit illustrated in FIG. 4, with a test circuit and with a memory area.

FIG. 9 illustrates a first tolerance analysis arrangement 10 with the first tolerance analysis circuit 4, with a test circuit DUT and with a memory area 11.

In this arrangement, the memory area 11 comprises a reference value database 12 and a counter 13. The first tolerance analysis circuit 4 is connected to the test circuit DUT in this embodiment such that it can receive and process measured values $x_p$ produced by the test circuit DUT. The first tolerance analysis circuit 4 is connected to the memory area 11 such that it can receive reference values $x_i$ and tolerance values $\Delta x_q$ from the reference value database 12 and can forward the output value $x_a$ which it produces to the counter 13. At least one of the connection fingers or pins of the test circuit DUT is connected to a suitable measuring instrument (not shown in FIG. 9) which is capable of applying test stimuli $x_k$ to the test circuit. In this embodiment, the input line for the test stimuli $x_k$ in the exemplary embodiment shown in FIG. 9 has a branch which forwards the test stimulus $x_k$ to the memory area 11 too, particularly to the reference value database 12.

In practice, a test stimulus $x_k$ is also called an input allocation or a sample. During operation of the first tolerance analysis arrangement 10, the measuring appliance produces a first test stimulus $x_k$ and applies it to the test circuit DUT. In parallel with this, the first test stimulus $x_k$ is also supplied to the reference value database 12.

In addition, the mode selection variable Set is applied to the first tolerance analysis circuit 4 as an input variable. In the most frequent mode of operation of the first tolerance analysis arrangement 10, the mode selection variable Set is stipulated and applied to the first tolerance analysis circuit 4 before the test stimuli $x_k$ are produced. However, it is likewise conceivable for the mode selection variable "Set" also to be produced afresh each time and applied to the first tolerance analysis circuit 4 in parallel with the production of each individual test stimulus $x_k$.

The test circuit DUT processes the test stimulus $x_k$ and produces a measured value $x_p$ which is output by the test circuit DUT and forwarded to the input of the first tolerance analysis circuit 4, particularly to the complement adder 43.

In parallel with this, a clear association is made in the reference value database 12 between the first test stimulus $x_k$ and one or more reference values $x_i$ and one or more tolerance values $\Delta x_q$. In this embodiment, the number of reference values $x_i$ associated with the test stimulus $x_k$ in this embodiment may differ from the number of reference values $\Delta x_q$ associated with the test stimulus $x_k$ if the control variables i and q of the reference value $x_i$ and of the tolerance value $\Delta x_q$ are in different forms. If precisely one control variable is provided for the two values, the number of reference values $x_i$ and tolerance values $\Delta x_q$ associated with the test stimulus $x_k$ is the same.

The reference values $x_i$ and the tolerance values $\Delta x_q$ are now applied to the first tolerance analysis circuit 4 in succession as input values. As already explained with reference to FIGS. 4 to 8, an output value $x_a$ is now produced for each triple ($x_p$; $x_i$; $\Delta x_q$). If a measured value $x_p$ has a plurality of reference values $x_i$ and a plurality of tolerance values $\Delta x_q$ in the reference value database 12, the first tolerance analysis circuit 4 produces a plurality of output values $x_a$ for the same measured value $x_p$. The number of output values $x_a$ to be produced in this embodiment corresponds to the number of different triples ($x_p$; $x_i$; $\Delta x_q$) in this embodiment.

The counter 13 is not required during operation of the first tolerance analysis arrangement 10 in the production test mode (Set=0). When a measured value $x_p$ which is not situated in the tolerance range first appears, the flag register FLR sets the output value $x_a$ permanently to 0. In the production test mode, the test can be terminated or the method described is repeated for the next test stimulus $x_k$ and for further test stimuli $x_k$ until all test stimuli $x_k$ have been processed and output values $x_a$ have been produced for all triples ($x_k$; $x_i$; $\Delta x_q$).

In the diagnosis mode (Set=1), the flag register FLR forwards every measurement response D obtained from the fine filter FIF as an output value $x_a$. The function of the flag register FLR which involves the output variable $x_a$ being set permanently to 0 when a single incorrect measured value $x_p$ appears is not activated in the diagnosis mode. Instead, the counter 13 is activated in the diagnosis mode, said counter recording the output values $x_a$ and associating them in the reference value database 12 with every pair comprising reference value $x_i$ and tolerance value $\Delta x_q$ and storing them in suitable fashion. Also in the diagnosis mode, when the first test stimulus $x_k$ has been processed the method described above is repeated until all of the test stimuli $x_k$ produced have been processed and an output value $x_a$ has been produced for each triple ($x_p$; $x_i$; $\Delta x_q$).

In the diagnosis mode, when the method has been executed it is possible to check the reference value database 12 to determine those pairs of reference values $x_i$ and tolerance values $\Delta x_q$ for which the test circuit DUT has delivered correct or incorrect measured values $x_p$.

The reference value $x_i$ having a particular tolerance value $\Delta x_q$ and corresponding to a test stimulus $x_k$ can be selected on the basis of the address of $x_k$. For a plurality of tolerance values $\Delta x_q$ which are to be examined, it is possible to provide various nominal value tables. These nominal value tables are processed by a controller, which is not shown in FIG. 9. The respective output values $x_a$=1 are then associated in the reference value database 12 with the associated tolerance values $\Delta x_q$ and are counted, which is also called "binning".

In the production test mode, only one $\Delta x_q = \Delta x_i$ is applied per test stimulus $x_k$. The test response $x_a$ is thus compacted in a 1-bit response. In this embodiment, the term "compacted" is to be understood to mean that precisely one 1-bit output value $x_a$ can establish whether all of the test stimuli $x_k$ applied have been processed correctly by the test circuit DUT or whether an error has arisen during the handling of at least one test stimulus $x_k$ by the test circuit DUT.

The entire test setup described in FIG. 9 can be implemented using logic and memories. In this embodiment, the reference value database 12 and the counter 13 can be produced using standard libraries or using registers. Such standard libraries and registers are known to the person skilled in the art and require no further explanation here.

Figure 10:
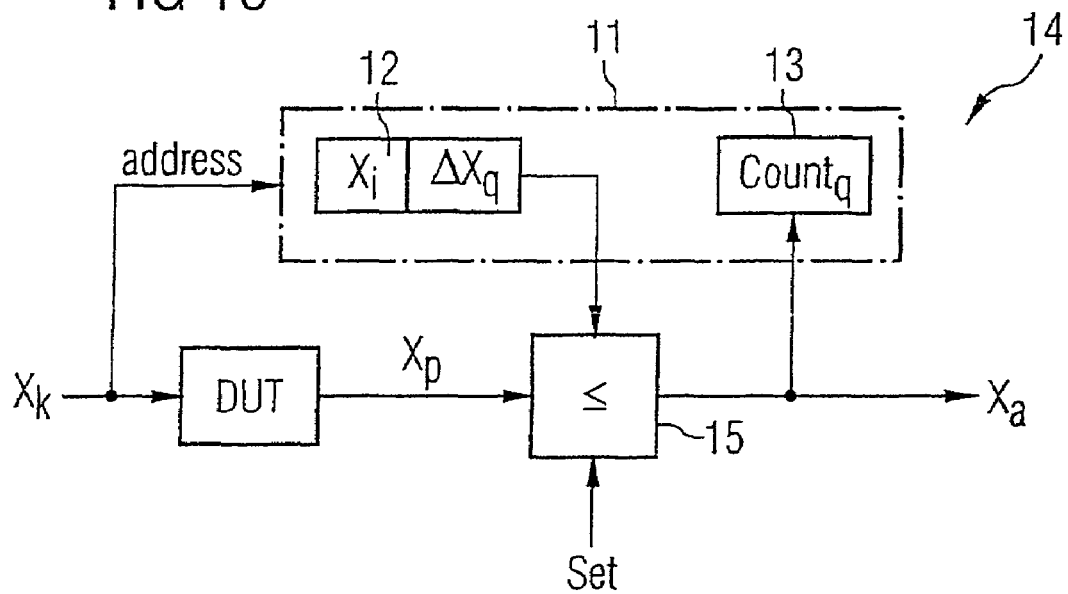
FIG. 10 illustrates a second tolerance analysis arrangement to explain possible areas of application for the invention.

FIG. 10 illustrates a second tolerance analysis arrangement 14 to explain possible areas of application of the invention.

In this embodiment, the second tolerance analysis arrangement 14 is based on the first tolerance analysis arrangement 10 from FIG. 9, with the first tolerance analysis circuit 4 being replaced by a second tolerance analysis circuit 15. Components which match in the first tolerance analysis arrangement 10 and in the second tolerance analysis arrangement 14 are identified by the same reference symbols and are not discussed again separately.

The second tolerance analysis circuit 15 corresponds to the first tolerance analysis circuit 4 explained with reference to FIGS. 3-8 only in terms of input variables $x_p$, $x_i$, $\Delta x_q$ and Set, in terms of its output variables $x_a$ and in terms of its operation.

The second tolerance analysis circuit 15 does not need to be in the form of a subtractor 41 or complement adder 43 in combination with a tolerance filter 42 in this embodiment, but rather may also be in the form of a μ-processor, in the form of a gate array or in the form of a digital signal processor DSP, for example.

The memory area 11 of a second tolerance analysis circuit 15 in the form of a μ-processor could be in the form of a random access memory (RAM) in this embodiment.

The manner of operation and hence the basic design of such a μ-processor, of such a gate array or of such a DSP is defined by the information provided in the present description of the figures in combination with the figures to such a precise extent that a person skilled in the art can actually create such a component from the information provided.

A more precise illustration of the specific refinement and of the specific design of such a μ-processor, of such a gate array and of such a DSP is dispensed with here for reasons of clarity, especially since illustrating the design of such components requires a very great deal of explanation and especially since the manner of operation of the second tolerance analysis circuit 15 would not become clearer through such illustration than it is already from the present description with reference to FIGS. 1 to 8.

A first area of application of the second tolerance analysis arrangement 14 is general tolerance measurement. In this embodiment, test stimuli $y_k$ produce test responses or measured values $x_p$ on a test circuit DUT. A characteristic of this general tolerance measurement is that each test stimulus $x_k$ has precisely one associated reference value $x_i$ and one or more associated tolerance values $\Delta x_q$. Following processing of the triples $(x_p; x_i; \Delta x_q)$, the counter 13 records the respective number of hits for the respective tolerance values $\Delta x_q$ for which the output value $x_a$ respectively assumes the value 1. When a series of test stimuli $x_k$ have been processed, the general tolerance measurement can be used to make a statement about which of the measured values $x_p$ which can clearly be associated with the test stimuli $x_k$ are situated in the tolerance classes $\Delta x_q$ provided by the tolerance values $\Delta x_q$ and which of them are not. Hence, precise test evaluation is possible for all test stimuli $x_k$ using the tolerance values $\Delta x_q$ associated with each test stimulus $x_k$.

A further field of application for the second tolerance analysis arrangement 14 is the eye diagram test for measuring time durations or period durations. Such an eye diagram test involves establishing unwanted small fluctuations in the time profile or amplitude profile. This is also called jitter or flutter. In such an eye diagram test, the test stimulus $x_k$, in the form of an activation signal or strobe, respectively assumes a fixed value. In this embodiment, a clock or clock generator, for example, may be provided as the measuring appliance or as the generator for the activation signal. In the embodiment of the eye diagram test, it is assumed that the test circuit DUT operates more or less independently, with only activation signals, for example in the form of clock signals, needing to be applied as test stimuli $x_k$. In the eye diagram test, all test responses or measured values $x_p$ from the test circuit DUT are sought which do not overwrite a defined eye aperture or do not leave a defined time tolerance range $\Delta x_q$. The measured values $x_p$ represent digitized period duration values for the horizontal eye aperture and digitized amplitude values for the vertical eye aperture. The reference values $x_i$ and the tolerance values $\Delta x_q$ are chosen according to the location of the evaluation of the eye or of the activation signal. For rising and falling clock edges, these values can also be chosen differently. By way of example, six settings for the reference value $x_i$ and for the tolerance value $\Delta x_q$ need to be chosen for an eye mask comprising six dots.

Another application of the second tolerance analysis arrangement 14 is data dependent jitter analysis. In the embodiment of data dependent jitter analysis, each test stimulus $x_k$ has precisely one reference value $x_i$ and precisely one tolerance value $\Delta x_q = \Delta x_i$ explicitly associated with it. The reference value $x_i$ and the tolerance value $\Delta x_i$ thus have the same respective control variable. During data dependent jitter analysis, the test response or the measured value $x_p$ from the test circuit DUT is sorted into tolerance classes $\Delta x_q$ for each test stimulus $x_k$, also referred to as golden data. In this embodiment, the measured values $x_p$ represent period duration values which are compared with the reference values $x_i$. In the production test mode, a tolerance value $\Delta x_q$ which cannot be exceeded by any measured value $x_p$ produced by a test stimulus $x_k$ is stipulated in this context. In the diagnosis mode, the individual fields of the counter 13 are associated with the tolerance classes $\Delta x_q$.

In line with another application, the second tolerance analysis arrangement 14 can be used for a DAC/ADC test or for a digital-analog-converter/analog-digital-converter test or for an ADC test or for an analog-digital-converter test. The test circuit DUT for such a DAC/ADC test is formed by a digital-analog-converter and by an analog-digital-converter, which can be found in a baseband or in a voice band loop test, for example. In this embodiment, a test is performed to determine whether the applied test stimuli $x_k$ in the form of amplitude values deliver the appropriate output values $x_a$ in the form of amplitude values. In this context, the test stimuli $x_k$, the measured values $x_p$ and the output values $x_a$ represent amplitude values which are needed in order to digitize physical variables, for example current and voltage profiles. In a correctly operating test circuit DUT, the measured value $x_p$ for a test stimulus $x_k$ is within an accepted tolerance range $\Delta x_q = \Delta x_i$ for the reference value $x_i = x_k$ in the form of a reference amplitude. Hence, the test stimulus $x_k$, the reference value $x_i$ and the tolerance value $\Delta x_k$ each have the same control variable in the DAC/ADC test. The DAC/ADC test normally delivers statistical statements. Under certain prerequisites, the test patterns $x_k$ can also be applied arbitrarily. As the generator for the test stimuli $x_k$, it is thus also conceivable to use a pseudorandom bit generator (PRB generator). Adjacent test stimuli $x_k$ may have no more than one discrepancy prescribed by the specification of the test circuit DUT. The counter 13 records the number of hits or 1-bit values for the output value $x_a$ for the respective tolerance class $\Delta x_q$ under consideration. In diagnosis mode, a plurality of tolerance classes $\Delta x_q$ per available reference amplitude $x_i = x_k$ may be recorded. The popular test strategy for the DAC/ADC test involves going through a "ramp", which may comprise sharply rising test stimuli $x_k$, for example, and in so doing checking the correct operation of the test circuit DUT for all measured values $x_p$.

A further conceivable application of the second tolerance analysis arrangement 14 is the pseudorandom bit test (PRB test). In this embodiment, a deterministic random sequence of test stimuli $x_k$ is applied to the test circuit DUT. The test response or the measured value $x_p$ is compared with the reference value $x_i$. In diagnosis mode, the tolerance value $\Delta x_q$ is associated. The counter 13 records the frequency of occurrence of a measured value $x_p$ within the tolerance classes $\Delta x_q$. In production test mode, all of the measured values $x_p$ are compacted in a 1-bit test response $x_a$ at the output, said test response making a statement (Pass/Fail) about the operability of the test circuit DUT. Each reference value $x_i$ is allocated a reference value $x_i$, a tolerance value $\Delta x_q = \Delta x_i$ and a counter 13 with the control variable i using the address of the test stimulus $x_k$. Hence, the reference value $x_i$, the tolerance value $\Delta x_i$ and the counter 13 have the same control variable i.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electric tolerance analysis circuit for tolerance analysis for digital and digitized measured values comprising:
a first input for receiving an n-bit measured value;
a second input for receiving an n-bit reference value ($x_i$);
a third input for receiving an (m+1)-bit tolerance value ($\Delta x_q$);
a checking device for checking the measured value using at least one prescribed tolerance criterion; and
an output device for outputting an output value ($x_a$) which is obtained from a state of the checking device, depending on whether or not the measured value ($x_p$) meets the prescribed tolerance criterion;
wherein the checking device can check the measured value ($x_p$) for the tolerance criterion $$(x_p - x_i) = \Delta x_q$$

or for the tolerance criterion $|x_p-x_i| \leq \Delta x_i$.

2. The circuit of claim 1, comprising:
the electric tolerance analysis circuit has a μ-processor, a gate array or a digital signal processor.

3. A loadboard system for holding a needle card for testing semiconductor chips or Ics and/or with one or more test sockets for testing semiconductor chips or ICs and/or for connecting a handler to a measuring appliance for testing semiconductor chips or ICs, comprising:
a loadboard; and
an electric tolerance analysis circuit as claimed in claim 1.

4. A measuring appliance system comprising:
a measuring appliance having sensors, particularly for currents and voltages, and with instruments for producing digital signals, intended for further processing using a computer system connected to the measuring appliance, from the measured values, particularly currents and voltages,
an electric tolerance analysis circuit as claimed of claim 1.

5. A computer system for recording digital signals produced by a measuring appliance, comprising:
an electric tolerance analysis circuit as claimed in claim 1.

6. The use of the apparatus as claimed in claim 1 for a general tolerance measurement, for an eye diagram test, for a data dependent jitter analysis, for an ADC test, for a random jitter test, for a deterministic jitter test, for a DAC/ADC test or for a pseudorandom bit test.

7. An electric tolerance analysis circuit for tolerance analysis for digital and digitized measured values, comprising:
a first input for receiving an n-bit measured value;
a second input for receiving an n-bit reference value ($x_i$);
a third input for receiving an (m+1)-bit tolerance value ($\Delta x_q$);
a checking device for checking the measured value using at least one prescribed tolerance criterion; and
an output device for outputting an output value ($x_a$) which is obtained from a state of the checking device, depending on whether or not the measured value ($x_p$) meets the prescribed tolerance criterion;
wherein the checking device has a subtractor and a tolerance filter connected to the subtractor;
where the subtractor has a first input for receiving the measured value ($x_p$) and a second input for receiving the reference value ($x_i$);
where the subtractor is designed such that a differential value ($x_p-x_i$) can be produced from the measured value ($x_p$) and from the reference value ($x_i$);
where the tolerance filter has an input for receiving the tolerance value ($\Delta x_q$) and a further input connected to the output of the subtractor; and
where the tolerance filter is designed such that the output value ($x_a$) can be produced using the tolerance value ($\Delta x_q$) and the differential value ($x_p-x_i$) provided by the subtractor.

8. The circuit of claim 7, comprising:
wherein the electric tolerance analysis circuit, including the tolerance filter, has a further input for receiving a mode selection variable (Set), where depending on the value of the mode selection variable (Set) the measured value ($x_p$) is checked using the tolerance criterion $(x_p-x_i)=\Delta x_q$ or using the tolerance criterion $|x_p-x_i| \leq \Delta x_i$.

9. The circuit of claim 7, comprising:
wherein the tolerance filter has a coarse filter, a fine filter and a flag register.

10. The circuit of claim 9, comprising:
wherein the input of the coarse filter is connected to the output of the subtractor or of the complement adder;
an input of the fine filter is connected to the output of the subtractor or of the complement adder;
a further input of the fine filter is connected to the output of the coarse filter;
a second further input of the fine filter is connected to a data line for receiving the tolerance value ($\Delta x_q$);
in that an input of the flag register is connected to the output of the fine filter; and
in that the output of the flag register is designed such that the output value ($x_a$) can be transmitted; and/or
a further input of the fine filter is connected to a data line for receiving the mode selection variable; and/or
a further input of the flag register is connected to a data line for receiving the mode selection variable.

11. The circuit of claim 9, comprising:
wherein the coarse filter has a NOR gate and a NAND gate;
where the coarse filter processes the (n+1−m) front bits of the differential value ($x_p-x_i$) produced by the subtractor or of the addition value ($x_p+\overline{x}_i$) produced by the complement adder; and
the coarse filter being designed such that an output can be produced which indicates whether the measured value ($x_p$) is above or below the reference value ($x_i$).

12. The circuit of claim 9, comprising:
wherein the fine filter looks at the m back bits of the differential value ($x_p-x_i$) produced by the subtractor or of the addition value $x_p+\overline{x}_i$) produced by the complement adder, the fine filter being designed such that a particularly 1-bit measurement response can be produced which indicates whether the measured value ($x_p$) meets the tolerance criterion ($x_p-x_i$)=$\Delta x_q$ or the tolerance criterion $|x_p-x_i| \leq \Delta x_i$.

13. The circuit of claim 9, comprising:
wherein the flag register has three NAND gates and an OR gate.

14. The circuit of claim 9, comprising:
wherein the production test mode a single failure to meet the tolerance criterion can be stored.

15. An electric tolerance analysis circuit for tolerance analysis for digital and digitized measured values, comprising:
a first input for receiving an n-bit measured value;
a second input for receiving an n-bit reference value ($x_i$);
a third input for receiving an (m+1)-bit tolerance value ($\Delta x_q$);
a checking device for checking the measured value using at least one prescribed tolerance criterion; and
an output device for outputting an output value ($x_a$) which is obtained from a state of the checking device, depending on whether or not the measured value ($x_p$) meets the prescribed tolerance criterion;
wherein the checking device has a complement adder and also a tolerance filter connected to the complement adder; and
where the complement adder has a first input for receiving the measured value ($x_p$) and a second inverting input for receiving the reference value ($x_i$), where the complement adder is designed such that a particularly (n+1)-bit addition value ($x_p+\overline{x}_i$) can be produced from the measured value ($x_p$) and from the ones' complement ($\bar{x}_i$) or from the two's complement the reference value ($x_i$), where the tolerance filter has an input for receiving the tolerance value ($\Delta x_q$) and a further input connected to the output of the complement adder, and where the tolerance filter is designed such that the output value (i) can be produced using the tolerance value ($\Delta x_q$) and the addition value ($x_p + \bar{x}_i$) provided by the complement adder.

16. A method for tolerance analysis for digital and/or digitized measured values comprising:

providing a tolerance analysis arrangement;

providing a test stimulus generator is provided;

producing a digital or digitized test stimulus ($x_k$) by the test stimulus generator;

synchronously applying the test stimulus ($x_k$) produced to the test circuit (DUT) and to the memory area;

producing a measured value ($x_p$) by processing the test stimulus ($x_k$) using the test circuit (DUT) and applying the measured value ($x_p$) produced to the electric tolerance analysis circuit;

at least one reference value ($x_i$) and at least one tolerance value ($\Delta x_q$) are associated with the test stimulus ($x_k$) by the reference value database of the memory area and the tolerance value ($\Delta x_q$) or the tolerance values ($\Delta x_q$) and the reference value ($x_i$) or the reference values ($x_i$) are applied to the electric tolerance analysis circuit;

producing an output value ($x_a$) by virtue of the checking device checking the measured value ($x_p$) for the tolerance criterion $$(x_p - x_i) = \Delta x_q$$

or for the tolerance criterion $$|x_p - x_i| \leq \Delta x_i,$$

producing the output value ($x_a$) at the output of the electric tolerance analysis circuit by the output device.

17. The method for tolerance analysis as claimed in claim 16, comprising:

prescribing a value for the mode selection variable and the mode selection variable is applied to the electric tolerance analysis circuit; and and in that producing an output value ($x_a$) is performed as follows:

producing an output value ($x_a$) by virtue of the electric tolerance analysis circuit checking the measured value ($x_p$) for the tolerance criterion $$(x_p - x_i) = \Delta x_q$$

if the mode selection variable (Set) assumes a prescribable value for selecting the diagnosis mode, or for the tolerance criterion $$|x_p - x_i| \leq \Delta x_i$$

if the mode selection variable (Set) assumes a prescribable value for selecting the production test mode.

18. The method for tolerance analysis of claim 17, comprising:

routing the output value ($x_a$) to the counter by the output device, the output value ($x_a$) is associated with a counter value for the respective reference value ($x_i$) being considered and for the respective tolerance value ($\Delta x_q$) being considered, and this counter value is incremented by the absolute value of the output value ($x_a$).

19. A computer program for performing a method for tolerance analysis for digital and/or digitized measured values comprising:

instructions for performing the method of claim 16.

20. The computer program as claimed in claim 19, which is held on a storage medium, particularly in a computer memory or in a random access memory.

21. The computer program as claimed in claim 19, which is transmitted on an electrical carrier signal.

22. A data storage medium with a computer program as claimed in claim 19.

23. A method in which a computer program as claimed in claim 19, is downloaded from an electronic data network, such as from the internet, to a computer which is connected to the data network.

24. A tolerance analysis circuit comprising:

an electric tolerance analysis circuit comprising:

a first input for receiving an n-bit measured value;

a second input for receiving an n-bit reference value ($x_i$);

a third input for receiving an (m+1)-bit tolerance value ($\Delta x_q$);

a checking device having a state for checking the measured value using at least one prescribed tolerance criterion; and an output device for outputting an output value ($x_a$) which is obtained from the state of the checking device, depending on whether or not the measured value ($x_p$) meets the prescribed tolerance criterion;

a test circuit for receiving and processing test stimuli ($x_k$) and for producing measured values ($x_p$);

a data line for transmitting measured values ($x_p$) which connects the output of the test circuit (DUT) to an input of the electric tolerance analysis circuit, particularly to an input of the subtractor or to an input of the complement adder;

a memory unit;

a further data line for transmitting reference values ($x_i$) and tolerance values ($\Delta x_q$) which connects at least one output of the memory unit to at least one input of the electric tolerance analysis circuit, particularly to the subtractor or to the complement adder and to the fine filter;

an input of the test circuit (DUT) and also an input of the memory unit (11) are provided for synchronously receiving test stimuli ($x_k$); and the memory unit can associate at least one reference value ($x_i$) and at least one tolerance value ($\Delta x_q$) with a respective test stimulus ($x_k$).

25. The tolerance analysis circuit of claim 24, comprising:

wherein the memory unit also comprises a counter which is connected by a further data line to the output device of the electric tolerance analysis circuit, the counter being configured such that counter readings can be associated with reference values ($x_i$) and tolerance values ($\Delta x_q$) stored in the memory unit, and can be incremented, on the basis of output values ($x_a$).

26. The tolerance analysis circuit of claim 24, comprising:

the memory unit has a reference value database, with the reference value database being designed such that it associates at least one respective reference value ($x_i$) and at least one respective tolerance value ($\Delta x_q$) with various test stimuli ($x_k$).

27. A needle card system for testing semiconductor chips or ICs, the needle card system comprising:
- a needle card; and
- an electric tolerance analysis circuit including:
- a first input for receiving an n-bit measured value;
- a second input for receiving an n-bit reference value ($x_t$);
- a third input for receiving an (m+1)-bit tolerance value ($\Delta x_q$);
- a checking device for checking the measured value using at least one prescribed tolerance criterion; and
- an output device for outputting an output value ($x_a$) which is obtained from a state of the checking device, depending on whether or not the measured value ($x_p$) meets the prescribed tolerance criterion.

* * * * *